United States Patent [19]

Tanahashi

[11] Patent Number: 5,459,943
[45] Date of Patent: Oct. 24, 1995

[54] AIR CLEANING APPARATUS

[75] Inventor: Takashi Tanahashi, Sagamihara, Japan

[73] Assignees: Tokyo Electron Limited, Tokyo;
Tokyo Electron Tohoku Limited,
Esashi, both of Japan

[21] Appl. No.: 191,603

[22] Filed: Feb. 4, 1994

[30] Foreign Application Priority Data

Feb. 4, 1993  [JP]  Japan .................................. 5-040408

[51] Int. Cl.$^6$ .................................................. F26B 21/00
[52] U.S. Cl. ......................... 34/82; 34/77; 55/267;
55/318; 55/338; 55/350.1; 55/385.2; 55/473;
55/523; 55/527; 96/142; 432/247
[58] Field of Search ......................... 55/267, 318, 338,
55/343, 350.1, 385.2, 467, 473, 523, 527;
96/134, 142; 34/76, 77, 79, 81, 82, 202,
212, 219, 224; 432/247; 454/56, 187

[56] References Cited

U.S. PATENT DOCUMENTS

| | | | |
|---|---|---|---|
| 3,538,615 | 11/1970 | Fuhring et al. | 96/142 |
| 3,824,770 | 7/1974 | Eckstein | 55/338 |
| 4,164,901 | 8/1979 | Everett | 55/267 |
| 4,726,824 | 2/1988 | Staten | 55/385.2 |
| 4,927,438 | 5/1990 | Mears et al. | 55/385.2 |
| 5,053,064 | 10/1991 | Hama et al. | 96/134 |
| 5,122,170 | 6/1992 | Satoh et al. | 96/134 |
| 5,261,167 | 11/1993 | Sakata | 55/385.2 |

FOREIGN PATENT DOCUMENTS

| | | | |
|---|---|---|---|
| 53-12904 | 5/1978 | Japan | 55/385.2 |
| 59-13243 | 3/1984 | Japan | 96/142 |
| 2-126912 | 5/1990 | Japan | 55/385.2 |

*Primary Examiner*—C. Scott Bushey
*Attorney, Agent, or Firm*—Oblon, Spivak, McClelland, Maier & Neustadt

[57] ABSTRACT

An air cleaning apparatus according to the present invention includes an apparatus body having a suction port through which air in a processing space is sucked and a discharge port through which the air sucked through the suction port is discharged into the processing space. A blower is provided in the apparatus body for sucking the air from the processing space into the apparatus body through the suction port and discharging the sucked air into the processing space through the discharge port. In addition an impurity gas removing device in the apparatus body is provided for removing impurity gases contained in the air sucked through the suction port and harmful to processing in the processing space, and a particle removing device is provided on the exhaust side of the impurity gas removing device for removing particles in the sucked air cleared of the impurity gases by impurity gas removing device.

19 Claims, 4 Drawing Sheets

AIR CLEANING APPARATUS

BACKGROUND OF THE INVENTION

A. Field of the Invention

The present invention relates to an air cleaning apparatus for cleaning air in ambient areas in or around processing units of various processing apparatuses.

B. Description of the Related Art

In order to finish processing of an object to a predetermined state without causing any impurities to adhere to the object, an ambient area in or around a processing unit for processing the object must be cleaned. For example, an air cleaner is incorporated in a CVD apparatus for forming a thin film on the surface of semiconductor wafers by chemical vapor deposition, in a semiconductor device manufacturing process. The air cleaner is designed so that impurities in an ambient area of the CVD apparatus are removed by means of a filter in a manner such that air in the apparatus, in which the semiconductor wafers are transported and processed, is circulated by means of a blast fan. In this arrangement, the impurities are prevented from adhering the to the semiconductor wafers, so that the wafers can be filmed with a high degree of accuracy. The following is a detailed description of a case in which the air cleaner of this type is applied to a CVD apparatus.

In general, a CVD apparatus, especially a vertical CVD apparatus, comprises a cylindrical processing unit in which semiconductor wafers are subjected to a filming process and other processes, a wafer boat for holding the wafers in the processing unit, and a transportation mechanism for supporting the wafer boat and delivering it into and from the processing unit. Further, the CVD apparatus comprises a transfer mechanism for transferring the semiconductor wafers to the wafer boat supported by the transportation mechanism, and a housing having a space in which these components of the apparatus are arranged.

A blast fan and a dusting filter for removing dust, such as particles, are arranged in the housing to prevent particles from adhering to the semiconductor wafers which are moved in the internal space of the housing by means of the transfer mechanism or together with the wafer boat. The blast fan forms an air flow which is directed from the rear portion of the space in the housing toward the front portion thereof. By disposing the dusting filter in the air flow in the housing, the air flow can be cleaned at all times, so that the particles can be prevented from adhering to the semiconductor wafers.

Semiconductor wafers have recently been increased in diameter, and their microfine working has been promoted, so that film layers, such as silicon oxide film, silicon nitride film, etc., formed on the wafers have been becoming thinner and thinner. Accordingly, the properties, such as electrical properties, of the film layers require stricter control, and a very small amount of impurities in the processing ambient have come to exert a great influence upon the workmanship of the film layers. In fine working of 16DRAM or more, fine particles which cannot be attributed only to adhesion of dust appear on the surface of the film layers. These fine particles worsen the electrical properties and other properties of the film layers, thereby lowering the yield.

In order to solve this problem, the inventor hereof made a detailed analysis and examination of the ingredients of impurities which would lower the electrical properties or other properties of the film layers of the semiconductor wafers, especially a very small amount of impurity gases in the processing ambient, by freely utilizing the up-to-date instrumental analysis technology. Thereupon, the inventor hereof ascertained that the very small amount of impurity gases constitute a main cause of the production of the aforesaid fine particles. Further, a qualitative analysis of the impurity gases contained in the air in the housing of the CVD apparatus revealed the existence of organic compounds such as hydrocarbon, phosphorus compounds, boron compounds, etc.

Accordingly, the inventor hereof further investigated the source of these impurity gases, and estimated that the main source was the synthetic resin material of the dusting filter, and that a very small amount of compounds remaining in the synthetic resin material had diffused into the housing and formed the impurity gases. Comparison between the compounds remaining in the synthetic resin material and the ingredients of the impurity gases detected by the gas analysis indicated their coincidence. It was also found that the impurity gases are generated from a clean room in which the CVD apparatus is installed, as well as from the dusting filter in the housing. Furthermore, it was indicated that substances which tend to accelerate the diffusion of boron compounds and the like from the dusting filter flow from the clean room into the CVD apparatus. Thus, the very small amount of impurity gases diffusing from the dusting filter (this diffusion is accelerated by the substances flowing from the clean room into the CVD apparatus in some cases), are transported to the processing ambient by means of the blast fan in the housing, and adhere to the film layers on the in-process semiconductor wafers, thereby producing fine particles on the surface of the film layers. In carrying the wafer boat out from the processing unit by means of the transportation mechanism after the filming process, in particular, the temperature in the housing is considerably increased by radiant heat from the wafer boat, so that the temperature of the dusting filter also increases, thereby accelerating the diffusion of the impurity gases from the dusting filter. Immediately after the filming process, moreover, the film layers are heated and chemically active. Due to these two factors, the fine particles are liable to be produced on the surface of the film layers.

SUMMARY OF THE INVENTION

The object of the present invention is to provide an air cleaning apparatus capable of removing impurity gases and particles which have bad influences upon processing of an object of processing.

The above object of the present invention is achieved by an air cleaning apparatus constructed as follows. The air cleaning apparatus comprises: an apparatus body having a suction port through which air in a processing space is sucked and a discharge port through which the air sucked through the suction port is discharged into the processing space; blower means in the apparatus body for sucking the air from the processing space into the apparatus body through the suction port and discharging the sucked air into the processing space through the discharge port; impurity gas removing means in the apparatus body for removing impurity gases contained in the air sucked through the suction port and harmful to processing in the processing space; and particle removing means on the exhaust side of the impurity gas removing means for removing particles in the sucked air cleared of the impurity gases by means of the impurity gas removing means.

Alternatively, the air cleaning apparatus may comprise an apparatus body having a suction port through which air outside a processing space is sucked and a discharge port through which the air sucked through the suction port is discharged into the processing space. In this case, the air outside the processing space is fed into the processing space after it is cleaned.

Preferably, in this arrangement, the impurity gas removing means is an activated charcoal filter which can remove the impurity gases. Particles which cannot be removed by the activated charcoal filter or particles generated from the activated charcoal filter are removed by means of a dusting filter, so that the air in the processing space can be kept clean at all times. When a semiconductor wafer was actually filmed in the processing space cleared of the impurity gases, generation of fine particles on the surface of the film layer did not occur.

Preferably, moreover, air cooling means, such as a radiator, is provided on the upper-course side of the activated charcoal filter in the air cleaning apparatus, with respect to the direction of suction, in particular, in consideration of the case where the processing space is subjected to high temperature such that the air sucked into the air cleaning apparatus is heated. This is because the activated charcoal filter is activated to shorten its own life when the heated air runs against the filter.

Preferably, furthermore, the particle removing means is a dusting filter which is formed of fiberglass or a metallic or ceramic material. If the dusting filter is formed of a metallic or ceramic material, in particular, the diffusion of the impurity gases from the dusting filter can be minimized. The generation of the impurity gases from the dusting filter, which is accelerated by heat, can be considerably restrained by means of the air cooling means.

DETAILED DESCRIPTION OF THE PREFERRED EMBODIMENTS

Figure 1:
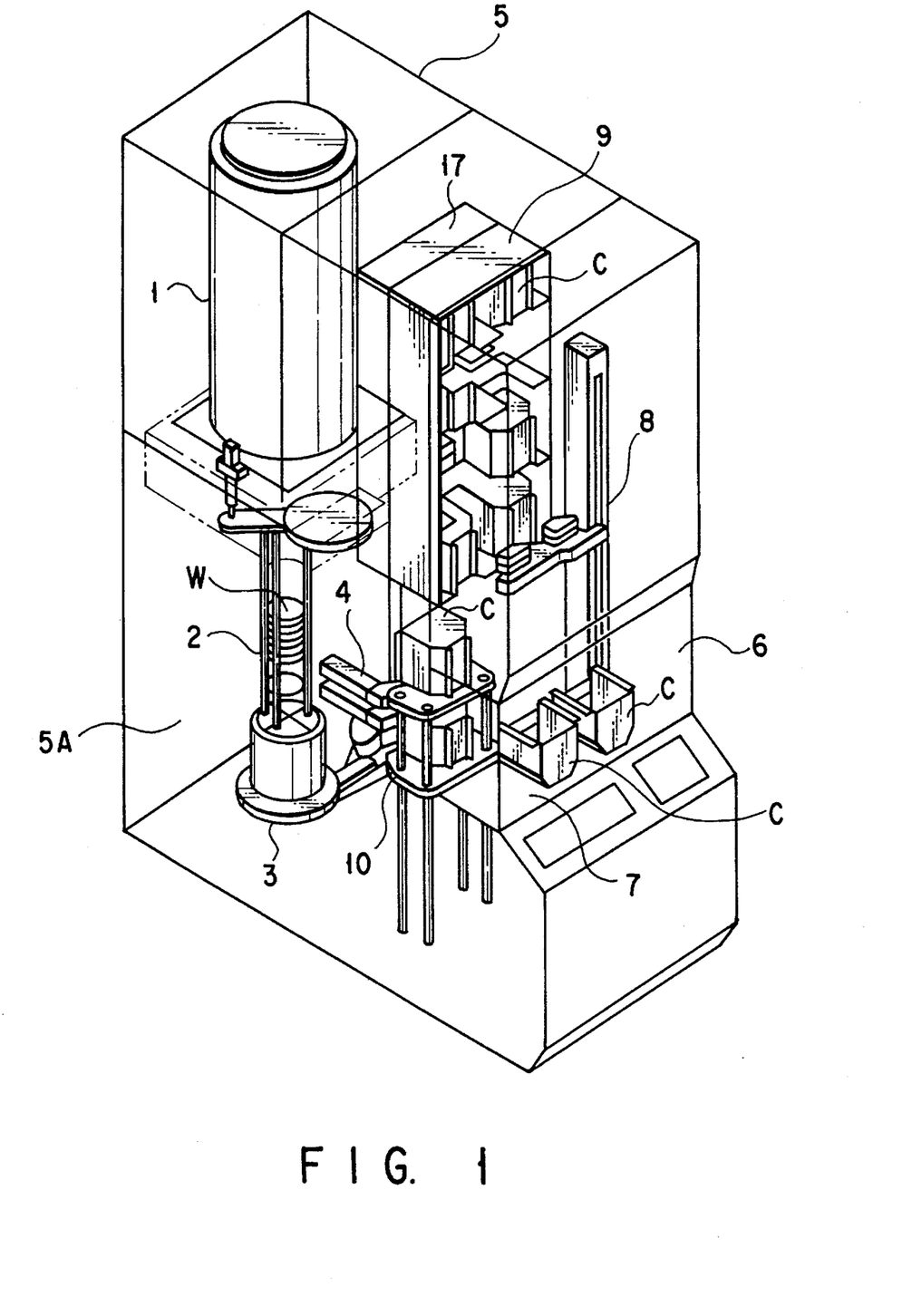
FIG. 1 is a perspective view of a CVD apparatus furnished with air cleaning apparatuses according to the present invention.

An embodiment of the present invention will now be described with reference to the accompanying drawings. FIG. 1 shows an arrangement of a CVD apparatus as an example of a processing apparatus. The CVD apparatus includes a processing unit 1 in the form of, for example, a closed-topped, open-bottomed cylinder, a wafer boat 2, a transportation mechanism 3, a transfer mechanism (hereinafter referred to as wafer transfer) 4, and a housing 5. A plurality of semiconductor wafers (objects of processing) W are arranged vertically at regular intervals in the wafer boat 2 so that they are kept horizontal in the processing unit 1. The transportation mechanism 3 delivers the wafer boat 2 into and from the unit 1. The wafer transfer 4 exchanges the semiconductor wafers W between the wafer boat 2 supported by means of the mechanism 3 and a wafer cassette C which can store, for example, 20 wafers w. The housing 5 has a space 5A in which all these elements are arranged. Formed in the front face of the housing 5 is an opening 6 which can be opened and closed by means of a door (not shown). The wafer cassette C, stored with the semiconductor wafers W, is delivered into and from the housing 5 through the opening 6 by means of a transportation robot (not shown). Disposed inside the opening 6 is a carrier IO port 7 which carries two wafer cassettes C in a manner such that the semiconductor wafers W are held vertically. As mentioned later, the port 7 forms a passage through which air flows downward from the upper side of the interior of the housing 5. Arranged in the port 7, moreover, are a wafer aligning mechanism (not shown) and a horizontal-vertical conversion mechanism (not shown). The aligning mechanism aligns the semiconductor wafers W in each wafer cassette C in a predetermined direction by utilizing the orientation flat of each wafer. The conversion mechanism rotates the wafer cassette C through 90° for horizontal-vertical conversion. Thus, the wafers W in the cassette C are arranged horizontally by the horizontal-vertical conversion mechanism after being aligned in the predetermined direction by the wafer aligning mechanism.

A carrier transfer mechanism (hereinafter referred to as carrier transfer) 8 is disposed inside the carrier IO port 7. The wafer cassette C is transferred to a shelved carrier stage 9 in the inner part of the housing 5 by means of the transfer 8. The carrier stage 9 can contain, for example, 8 wafer cassettes C in both vertical and horizontal directions, thus storing the wafer cassettes C which contain the semiconductor wafers W having already been processed or bound to be processed in the processing unit 1.

A transfer stage 10 is disposed under the carrier stage 9, and the wafer cassettes C are exchanged between the stages 9 and 10 by means of the carrier transfer 8. Further, the semiconductor wafers W are exchanged between the wafer cassette C transferred to the transfer stage 10 and the wafer boat 2 supported by the transportation mechanism 3, by means of the wafer transfer 4. Thus, the wafer transfer 4 picks up the unprocessed semiconductor wafers W from the wafer cassette C on the transfer stage 10 and transfers them to the wafer boat 2 one after another. Also, the transfer 4 picks up the processed semiconductor wafers w successively from the wafer boat 2 and transfers them to the wafer cassette C on the transfer stage 10.

Figure 2:
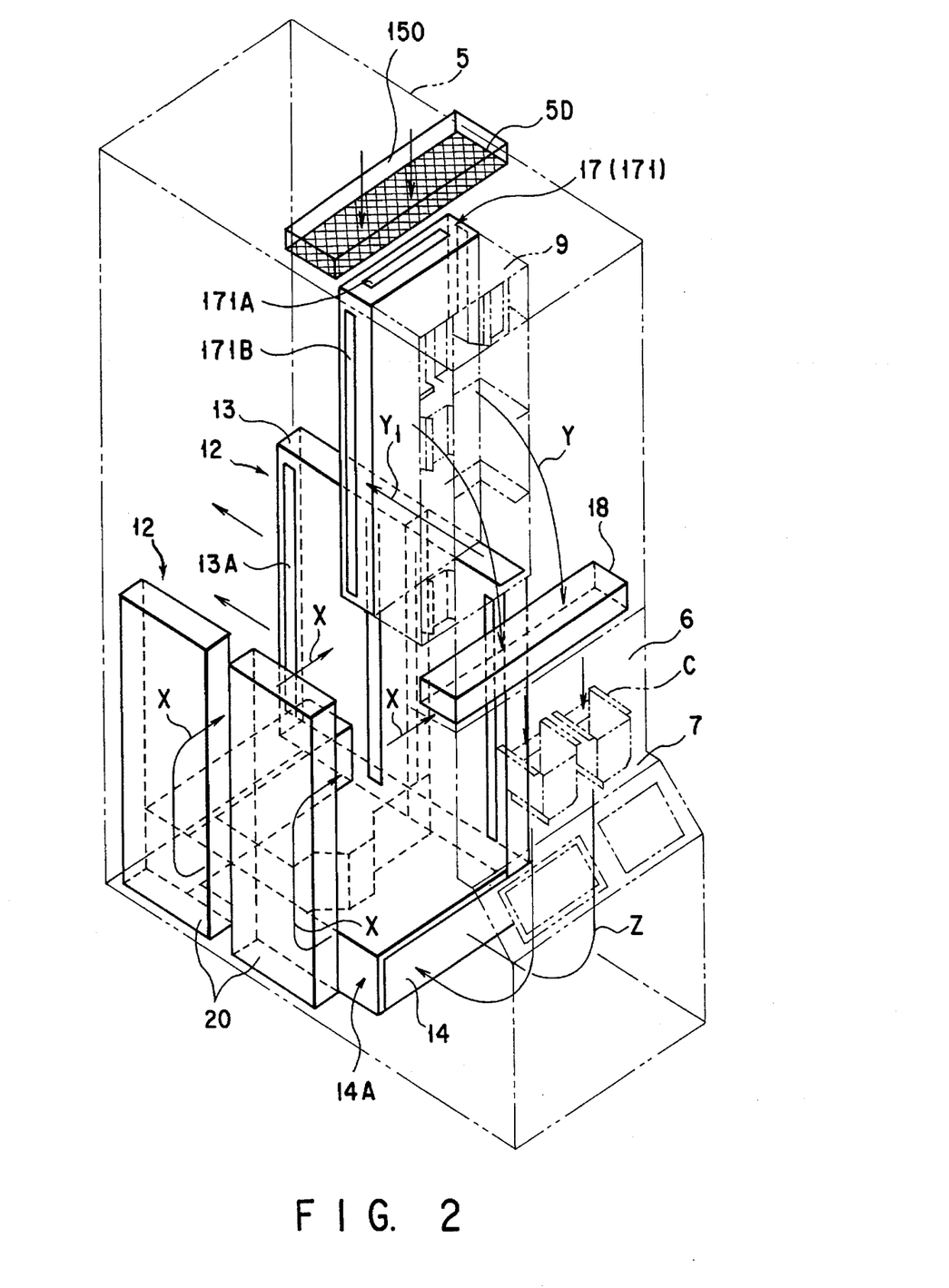
FIG. 2 is a diagram for illustrating air circulation in a housing of the CVD apparatus shown in FIG. 1.
Figure 3:
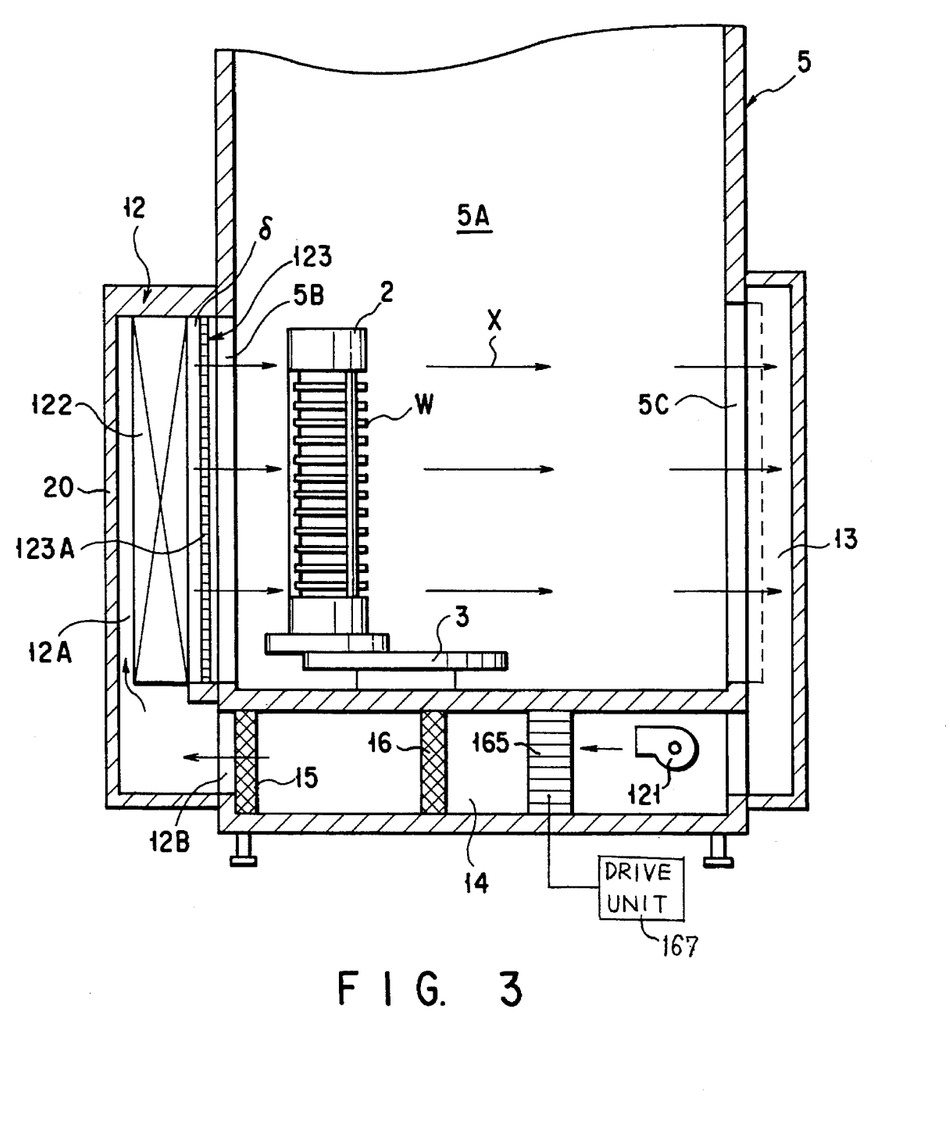
FIG. 3 is a side view showing the internal space of the housing of the CVD apparatus shown in FIG. 1.

As shown in FIGS. 2 and 3, the CVD apparatus includes a first air cleaning apparatus 12 which has a discharge port 5B and a suction port 5C on either side of the housing 5. The main body of the apparatus 12 includes two air cleaning sections 20, which are arranged on one side of the space 5A of the housing 5, or more specifically, the left-hand side opening (discharge port) 5B of the housing 5, and serve also as single-swing doors for maintenance. The apparatus body further includes a side duct 13, arranged in the right-hand side opening (suction port) 5C of the housing 5, and a bottom duct 14 at the bottom of the space 5A. As shown in FIG. 3, a first blower 121 for sucking air through the suction port 5C and sending it is provided in that region of the bottom duct 14 near the port 5C. Each air cleaning section 20 is provided with a container which constitutes a door, an opening 12B communicating the interior of the container and the bottom duct 14, a first dusting filter 122 formed of, e.g., an HEPA filter disposed in the container, and an equalizing plate 123. The filter 122 removes particles contained in the air which is fed through a duct portion 12A by the blower 121. The equalizing plate 123 is arranged parallel with and inside the first dusting filter 122, with a gap δ between the filter 122 and has a number of holes 123A, so that the dusted air is uniformly sent from the front side of the plate 123 to the side duct 13 in the right-hand side opening 5C of the housing 5.

As shown in FIG. 2, the side duct 13 has inside slits (suction ports) 13A through which passes the air from the air cleaning sections 20. The side duct 13 and the cleaning sections 20 communicate with one another at their respective bottom portions by means of the bottom duct 14 at the bottom of the space 5A. The bottom duct 14, the respective duct portions 12A of the air cleaning sections 20, and the side duct 13 constitute an air circulation path. Thus, the air fed from the air cleaning sections 20 into the space 5A in the housing 5, returns into the air cleaning sections 20 through the side duct 13 and the bottom duct 14, thereby forming a horizontal circulating flow X in the space 5A. The particles in the circulating air are repeatedly removed by means of the dusting filter 122, whereby the circulating air flow X can be cleaned at all times.

A slit (not shown) is formed in the outer surface of the side duct 13, and part of the circulating air is discharged through the slit. As mentioned hereinafter, on the other hand, an air inlet 5D, which is defined by a metal mesh, is formed in the upper surface of the housing 5. An amount of air equivalent to the exhaust is introduced through the inlet 5D from a clean room (not shown), in which the CVD apparatus is located, and air for the circulating flow X is replenished. Thus, the pressure in the housing 5 can be kept constant. The CVD apparatus is designed so that the circulating flow X in the housing 5 is formed mainly of the air in the housing 5, and part of the flow X can be replaced through the air inlet 5D and the slit of the side duct 13. An activated charcoal filter 172, which constitutes a second air cleaning apparatus 17 (discussed hereinafter), is disposed at the top portion of the air inlet 5D. The air from the clean room is fed into the housing 5 of the CVD apparatus through the filter 172. Housed in the bottom duct 14, moreover, are a control device for controlling the transportation mechanism 3, wafer transfer 4, etc. and wiring members.

First and second activated charcoal filters 15 and 16 are arranged in the bottom duct 14. A radiator 165 for cooling the circulating air is disposed on the upper-course side of the filters 15 and 16 with respect to the direction of suction. The radiator 165 is driven by a drive unit 167 to cool the circulating flow X passing through the radiator 165 at a predetermined temperature. Moreover, the first blower 121 is located on the upper-course side of radiator 165. The activated charcoal filters 15 and 16 adsorb a very small amount of impurity gases (hereinafter called organic compounds such as hydrocarbon, phosphorus compounds, boron compounds, etc. or gases based on gases formed in the filming process) generated from the first dusting filter 122 and dusting filters 174 of second and third air cleaning apparatuses 17 and 18 (discussed hereinafter), etc., thereby preventing these impurity gases from getting into the circulating flow X in the space 5A of the housing 5.

In the first air cleaning apparatus 12, as described above, the air in the space 5A is sucked in through the suction port 5C and sent again to the space 5A by means of the first blower 121. In doing this, the high-temperature air in the space 5A heated by means of radiant heat from the wafer boat 2 is first cooled by means of the radiator 165. Then, a very small amount of impurity gases (gases from the first dusting filter 122 and ones attributable to the filming process) in the cooled air are removed by adsorption by means of the activated charcoal filters 15 and 16 in the bottom duct 14. Also, particles (including ones produced by the filters 15 and 16) contained in the air discharged into the duct portion 12A are removed by means of the first dusting filter 122. Thus, clean air is fed into the space 5A to form the circulating flow X.

Since the first air cleaning apparatus 12 can prevent high-temperature air from touching the activated charcoal filters 15 and 16 and the dusting filter 122 by means of the radiator 165, the life/performance of the filters 15 and 16 can be improved, and the generation of the impurity gases from the dusting filter 122 cannot be accelerated by heat. Since the filters 15, 16 and 122 are located in the bottom duct 14, moreover, they can never be directly subjected to the radiant heat from the wafer boat 2. The radiator 165 may be situated in a position where it directly receives the radiant heat from the wafer boat 2, for example, in the region corresponding to the suction port 5C. The dusting filter 122 is formed of fiber glass or metallic or ceramic material. If the filter 122 is formed of metallic or ceramic material, in particular, the generation of the impurity gases therefrom can be minimized.

In the first air cleaning apparatus 12, the two activated charcoal filters 15 and 16 are arranged in succession on the upper-course side of the first dusting filter 122. Therefore, the time for the contact between the filters 15 and 16 and the impurity gases in the air which forms the circulating flow X can be extended. Thus, the impurity gases can be securely removed by means of the activated charcoal filters.

The activated charcoal filters 15 and 16 and activated charcoal filters 172 and 173 of the second and third air cleaning apparatuses 17 and 18 (discussed hereinafter) are each fabricated by, for example, reducing activated charcoal particles to fibers, and forming the fibers into a porous mat or a sheet with a number of dispersed pores. These filters serve as the so-called prefilters.

Figure 4:
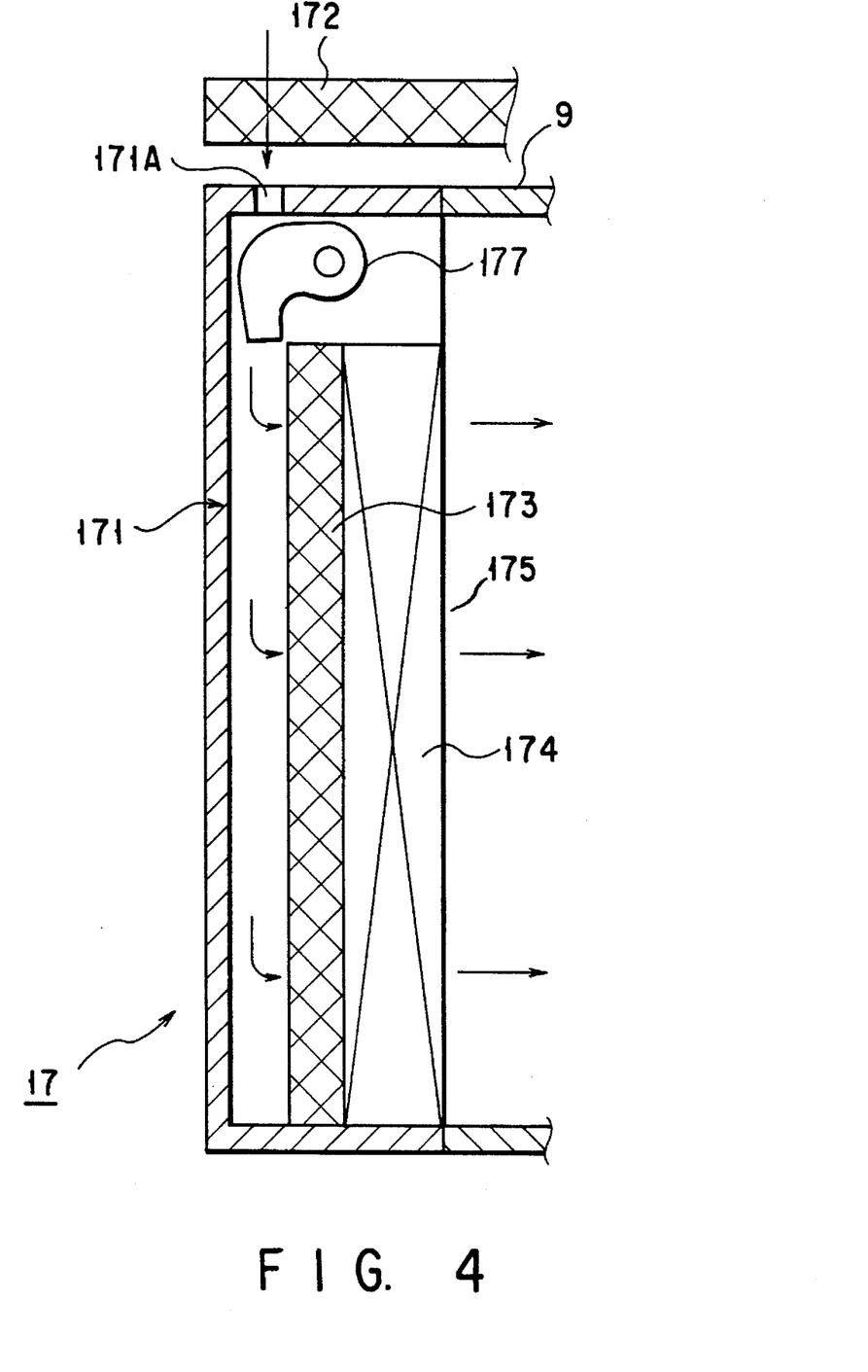
FIG. 4 is a sectional view of an air cleaning apparatus located in the top portion of the CVD apparatus shown in FIG. 1.

Provided in the top portion of the housing 5, on the other hand, is the second air cleaning apparatus 17 which prevents the impurity gases and particles in the clean room from getting into the housing 5. As shown in FIG. 2, the apparatus 17 extends along the back of the carrier stage 9, and is situated under the air inlet 5D. Moreover, the third activated charcoal filter 172 is located over the inlet 5D in close vicinity thereto. As shown in FIG. 4, the second air cleaning apparatus 17 comprises a container (apparatus body) 171, a second blower 177, the fourth activated charcoal filter 173, and the second dusting filter 174. The container 171 has a slit (suction port) 171A which faces the air inlet 5D of the housing 5. The second blower 177 serves to introduce a small amount of air from the clean room into a discharge port 175, which opens to the carrier stage 9, through the slit 171A of the container 171 and the inlet 5D. The fourth activated charcoal filter 173, which is located on the upper-course side of the discharge port 175, adsorbs and removes a very small amount of impurity gases in the air sent by means of the second blower 177. The second dusting filter 174 is used to remove particles from the air passed through the filter 173. Thus, the air cleared of the impurity gases and the particles is delivered to the semiconductor wafers W stored on the carrier stage 9, thereby forming an air flow Y, as shown in FIGS. 2 and 4. An air flow $Y_1$, which is reflected and returned by the front face of the housing 5, is sucked into the container 171 through slits 171B in the opposite side faces of the container 171 by means of the second blower 177. Thus, the impurity gases generated from the second dusting filter 174 are removed by adsorption by means of the fourth activated charcoal filter 173.

According to the arrangement described above, the two activated charcoal filters 172 and 173 are arranged in succession on the upper-course side of the second dusting filter 174. Therefore, the time for the contact between the filters 172 and 173 and the impurity gases in the air in the clean room can be extended. Thus, the impurity gases can be securely removed by means of the activated charcoal filters.

The third air cleaning apparatus 18 is provided on the lower-course side of the air flow Y over the carrier IO port 7. The apparatus 18 sucks in most of the air flow Y and forms a descending air flow Z. The third air cleaning apparatus 18 comprises a third blower, a fifth activated charcoal filter, and a third dusting filter on the lower-course side of the fifth activated charcoal filter (none of which are shown), and is arranged in the same manner as the second air cleaning apparatus 17. The apparatus 18 is designed so as to remove a very small amount of impurity gases contained in the descending air flow z and diffused from the second dusting filter 174 and residual particles, and send the cleaned air through an opening 14A into the bottom duct 14 via the carrier IO port 7, thereby allowing it to join the air returned from the side duct 13. The impurity gases generated from the third dusting filter of the third air cleaning apparatus 18 are removed by adsorption by means of the activated charcoal filters 15, 16 in the bottom duct 14.

The following is a description of the operation of the CVD apparatus furnished with the air cleaning system arranged in this manner. In subjecting, for example, 8-inch semiconductor wafers W to a filming process or the like by means of the CVD apparatus, the processing unit 1 is first heated to a predetermined temperature, depending on the details of processing for the wafers W, and the first, second, and third air cleaning apparatuses 12, 17 and 18 are driven. The apparatuses 12, 17 and 18 form the circulating flows X, Y and Z, respectively, in the housing 5, as indicated by the arrows in FIG. 2. Thereafter, two wafer cassettes C, stored with the semiconductor wafers W each, are placed in position in the carrier IO port 7 by means of the transportation robot. The wafers W in each cassette C in the port 7 are aligned in the predetermined direction and set in a horizontal state by means of the wafer aligning mechanism and the horizontal-vertical conversion mechanism. In this state, the cassettes C are transferred to the carrier stage 9 by the carrier transfer 8. After a given number of wafer cassettes C are stored on the carrier stage 9 by repeating this operation several times, the door (not shown) of the opening 6 is closed.

when the wafer cassettes C on the carrier stage 9 are transferred to the transfer stage 10 by the carrier transfer 8, thereafter, the semiconductor wafers w in the wafer cassettes C on the stage 10 are successively transferred to the wafer boat 2 by the wafer transfer 4. When a given number of semiconductor wafers W are transferred to the wafer boat 2, the transportation mechanism 3 is driven to feed the boat 2 into the processing unit 1, whereupon the wafers W are processed in a specific ambient/environment at a predetermined temperature for a given period of time. When processing the semiconductor wafers W is completed, the wafers are in reverse from the processing unit 1 reversely following the aforesaid sequence.

When the first air cleaning apparatus 12 is driven during the semiconductor wafer processing operation, the circulating flow X is formed in the housing 5 of the CVD apparatus by the apparatus 12. Thereupon, clean air is always circulated in the housing 5, so that particles and impurity gases can be prevented from adhering to the semiconductor wafers W. Thus, when the first blower 121 is driven to suck air through the bottom duct 14 of the housing 5, the air flows through the activated charcoal filters 15, 16 into the duct portions 12A in the air cleaning sections 20. At this time, a very small amount of impurity gases in the air sucked through the bottom duct 14 into the duct portions 12A are removed by adsorption by means of the filters 15, 16. As the air introduced into the air cleaning sections 20 passes through the first dusting filter 122, thereafter, a very small amount of particles are removed by the filter 122. The air cleaned by means of the filters 15, 16 and 122 is delivered uniformly into the whole region of the space 5A by means of the equalizing plate 123 which is situated on the lower-course side of the first dusting filter 122, and is fed through the slits 13A into the side duct 13. Most of the air introduced into the side duct 13 is sucked, through the lower portion of the duct 13, into the bottom duct 14 by means of the first blower 121, and forms the circulating flow X in the space 5A. Thus, a very small amount of impurity gases diffused from the first dusting filter 122 and a very small amount of formed gases attributable to the filming process are removed again from the reflux air by adsorption by means of the activated charcoal filters 15, 16.

As the circulating flow X of clean air cleared of the impurity gases and particles is thus formed in the space 5A, the impurity gases and particles are prevented from adhering to the semiconductor wafers w moving in the space 5A. Thus, deterioration of the electrical properties of the wafers W, which is believed to be caused by impurity gases, can be restrained in particular.

Meanwhile, the air which forms the circulating flow X is partially discharged through the side duct 13. An amount of air equivalent to the exhaust from the duct 13 is resupplied from the clean room by means of the second air cleaning apparatus 17. Thus, when the second blower 177 is driven, the air from the clean room is introduced through the air inlet 5D of the housing 5 and the slit 171A of the container 171. The air retrieved from the clean room is delivered toward the carrier stage 9 by the second blower 177, and forms the air flow Y which is directed to the front face of the housing 5. Part of the air flow Y returns as the air flow $Y_1$ from the front face of the housing 5, is sucked again into the container 171 through the slit 171B, and joins the air from the clean room. However, most of the air flow Y is guided downward by suction by means of the third air cleaning apparatus 18, and forms the descending air flow Z. AS the descending air flow Z passes through the third air cleaning apparatus 18, a very small amount of impurity gases in the flow Z and residual particles are removed by means of the fifth activated charcoal filter and the third dusting filter. Thereafter, the cleaned descending air flow Z is delivered into the bottom duct 14, whereupon it joins the clean circulating flow X returning from the side duct 13 to the bottom duct 14. The clean air flows (descending air flow Z and circulating flow X) in different directions, which join in the bottom duct 14, are passed through the activated charcoal filters 15, 16 and dedusted in the air cleaning sections 20. Thus, the circulating flow X is formed as a clean one-direction flow.

The CVD apparatus which is provided with the air cleaning apparatuses according to the present embodiment, as described herein, is arranged so that air flows are formed around the circulating flow X in the space 5A of the housing 5, and the air in the housing 5 is continually circulated by means of the air flows to remove the particles and impurity gases in the air. More specifically, the particles in the air are removed by means of the dusting filters 122 and 174 of the first to third air cleaning apparatuses 12, 17 and 18, while the impurity gases from the filters 122 and 174 and the gases attributable to the filming process are removed by means of the activated charcoal filters 15, 16, 172 and 173. Accordingly, the impurity gases and particles, which are regarded as harmful to the semiconductor wafers W, can be prevented from adhering to the wafers W in the housing 5. Thus, the electrical properties of the surface of each wafer W and the surface of its film layer can be prevented from being lowered, so that the yield can be improved.

According to the present embodiment, in particular, the circulating flow X as the center of the air circulation is formed in the space 5A by means of the first air cleaning apparatus 12, and the particles and impurity gases are removed by the activated charcoal filters 15 and 16 of the apparatus 12, whereby the impurity gases are prevented from adhering to the film layers which are chemically active in a high-temperature state immediately after processing operation. Thus, chemical reactions between the impurity gases and the film layers are prevented, so that fine particles cannot be produced, and deterioration of the properties, such as electrical properties, of the film layers can be restrained considerably or prevented.

It is to be understood that the present invention is not limited to the embodiment described above, and that various changes and modifications may be effected therein by one skilled in the art without departing from the scope or spirit of the invention. According to the above-described embodiment, in particular, each activated charcoal filter is in the form of a mat or a sheet with a number of dispersed pores. However, the activated charcoal filters used in the present invention may be any ones which are air permeable and can adsorb impurity gases, and their configurations are not limited in particular. Moreover, the number and location of the activated charcoal filters may be suitably set in accordance with the installation conditions and construction of the processing apparatus.

What is claimed is:

1. An air cleaning apparatus comprising:
   a first air cleaning section having first blower means for forming a circulating air flow in an X direction in a processing space;
   a second air cleaning section having second blower means for forming an air flow in a Y direction in said processing space;
   a third air cleaning section having third blower means for forming an air flow in a Z direction in said processing space;
   impurity gas removing means, respectively provided in said first to third air cleaning sections, for respectively removing impurity gases which are contained in the air flows formed by said first to third blower means, which impurity gases are harmful to processing in said processing space; and
   particle removing means, respectively provided on exhaust sides of said impurity gas removing means of said first to third air cleaning sections, for respectively removing particles contained in the air flows from which the impurity gases are removed by said impurity gas removing means.

2. An air cleaning apparatus according to claim 1, wherein said second blower means makes the air flow formed in the Y direction confluent with the air flow formed in the Z direction by said third blower means.

3. An air cleaning apparatus according to claim 2, wherein said third blower means makes the air flow formed in the Z direction confluent with the circulating air flow formed in the X direction by said first blower means.

4. An air cleaning apparatus according to claim 1, wherein said first air cleaning section exhausts an amount of air from the circulating air flow formed in the X direction to the outside of said processing space, and one of said first and second air cleaning sections sucks air, an amount of which is equal to the said amount of air which is exhausted by said first air cleaning section, into said processing space.

5. An air cleaning apparatus according to claim 1, wherein said second blower means circulates the air flow formed in the Y direction in the Y direction.

6. An air cleaning apparatus according to claim 1, wherein said impurity removing means includes at least one activated charcoal filter.

7. An air cleaning apparatus according to claim 1, wherein said particle removing means includes at least one dusting filter formed of glass fiber.

8. An air cleaning apparatus according to claim 1, wherein said particle removing means includes at least one dusting filter formed of one of a metallic material and a ceramic material.

9. An air cleaning apparatus according to claim 1, further comprising air cooling means for cooling air of the circulating air flow formed in the X direction before the circulating air flow reaches said impurity gas removing means.

10. A heat processing apparatus comprising:
    a housing having a processing unit for heat-processing a semiconductor wafer;
    a first air cleaning section, provided in said housing, having first blower means for forming a circulating air flow in an X direction in said housing;
    a second air cleaning section, provided in said housing, having second blower means for forming an air flow in a Y direction in said housing;
    a third air cleaning section, provided in said housing, having third blower means for forming an air flow in a Z direction in said housing;
    impurity gas removing means, respectively provided in said first to third air cleaning sections, for respectively removing impurity gases which are contained in the air flows formed by said first to third blower means, which impurity gases are harmful to heat-processing in said processing unit; and
    particle removing means, respectively provided on exhaust sides of said impurity gas removing means, for respectively removing particles contained in the air flows from which the impurity gases are removed by said gas removing means.

11. A heat processing apparatus according to claim 10, wherein said impurity gas removing means and said particle removing means are situated on an internal portion of said housing to which radiation heat is not conducted.

12. A heat processing apparatus according to claim 10, wherein said second blower means makes the air flow formed in the Y direction confluent with the air flow formed in the Z direction by said third blower means.

13. A heat processing apparatus according to claim 12, wherein said third blower means makes the air flow formed in the Z direction confluent with the circulating air flow formed in the X direction by said first blower means.

14. A heat processing apparatus according to claim 10, wherein said first air cleaning section exhausts an amount of air from the circulating air flow formed in the X direction to the outside of said housing, and one of said second and third air cleaning sections sucks air, an amount of which is equal to said amount of air which is exhausted by said first air cleaning section, into said housing.

15. A heat processing apparatus according to claim 10, wherein said second blower means circulates the air flow formed in the Y direction in the Y direction.

16. A heat processing apparatus according to claim 10, wherein said impurity gas removing means includes at least one activated charcoal filter.

17. A heat processing apparatus according to claim 10, wherein said particle removing means includes at least one dusting filter formed of glass fiber.

18. A heat processing apparatus according to claim 10, wherein said particle removing means is at least one dusting filter formed of one of a metallic material and a ceramic material.

19. A heat processing apparatus according to claim 10, further comprising air cooling means for cooling air of the circulating air flow formed in the X direction before the circulating air flow reaches said impurity gas removing means.

* * * * *